United States Patent [19]
Babu et al.

[11] Patent Number: 5,061,359
[45] Date of Patent: * Oct. 29, 1991

[54] PLASMA PROCESSING APPARATUS INCLUDING THREE BUS STRUCTURES

[75] Inventors: Suryadevara V. Babu, Potsdam; Neng-hsing Lu, Endwell; Carl-Otto Nilsen, Vestal, all of N.Y.

[73] Assignee: International Business Machines Corporation, Armonk, N.Y.

[*] Notice: The portion of the term of this patent subsequent to Jul. 22, 2003 has been disclaimed.

[21] Appl. No.: 468,422

[22] Filed: Jan. 22, 1990

Related U.S. Application Data

[60] Division of Ser. No. 409,289, Sep. 18, 1989, which is a continuation of Ser. No. 199,838, May 27, 1988, abandoned, which is a continuation of Ser. No. 894,240, Aug. 4, 1986, abandoned, which is a continuation of Ser. No. 692,144, Jan. 17, 1985, abandoned.

[51] Int. Cl.$^5$ .............................................. C23C 14/00
[52] U.S. Cl. ................... 204/298.07; 156/345; 156/643; 204/298.03; 204/298.33; 204/298.34; 204/298.39
[58] Field of Search ............... 204/298.07, 298.08, 204/298.33, 298.34, 298.39; 156/345, 643

[56] References Cited

U.S. PATENT DOCUMENTS

| | | | |
|---|---|---|---|
| 4,264,393 | 4/1981 | Gorin et al. | 156/345 |
| 4,282,077 | 8/1981 | Reavill | 204/192 E |
| 4,297,162 | 10/1981 | Mundt jet al. | 156/643 |
| 4,425,210 | 1/1984 | Fazlin | 204/192 E |
| 4,601,807 | 7/1986 | Lo et al. | 204/298 |

Primary Examiner—John Niebling
Assistant Examiner—William T. Leader
Attorney, Agent, or Firm—Lawrence R. Fraley

[57] ABSTRACT

A system for plasma etching predetermined portions of material on the major surfaces of a plurality of substrates. The system comprises a plurality of electrodes substantially parallel to each other and to substrates alternating therewith. Each of the electrodes is of a hollow configuration and includes a pair of flat sides, each side having a plurality of tapered apertures therein. A means for directing a reactive gas through the apertures toward the substrates is provided. A first bus structure electrically connects the substrates and may be grounded. A second bus structure electrically connects alternate ones of the electrodes and is connected to a first radio frequency power source. A third bus structure electrically connects the remaining ones of the electrodes and is connected to a second radio frequency power source adapted to operate 180 degrees out of phase with the first power source.

3 Claims, 5 Drawing Sheets

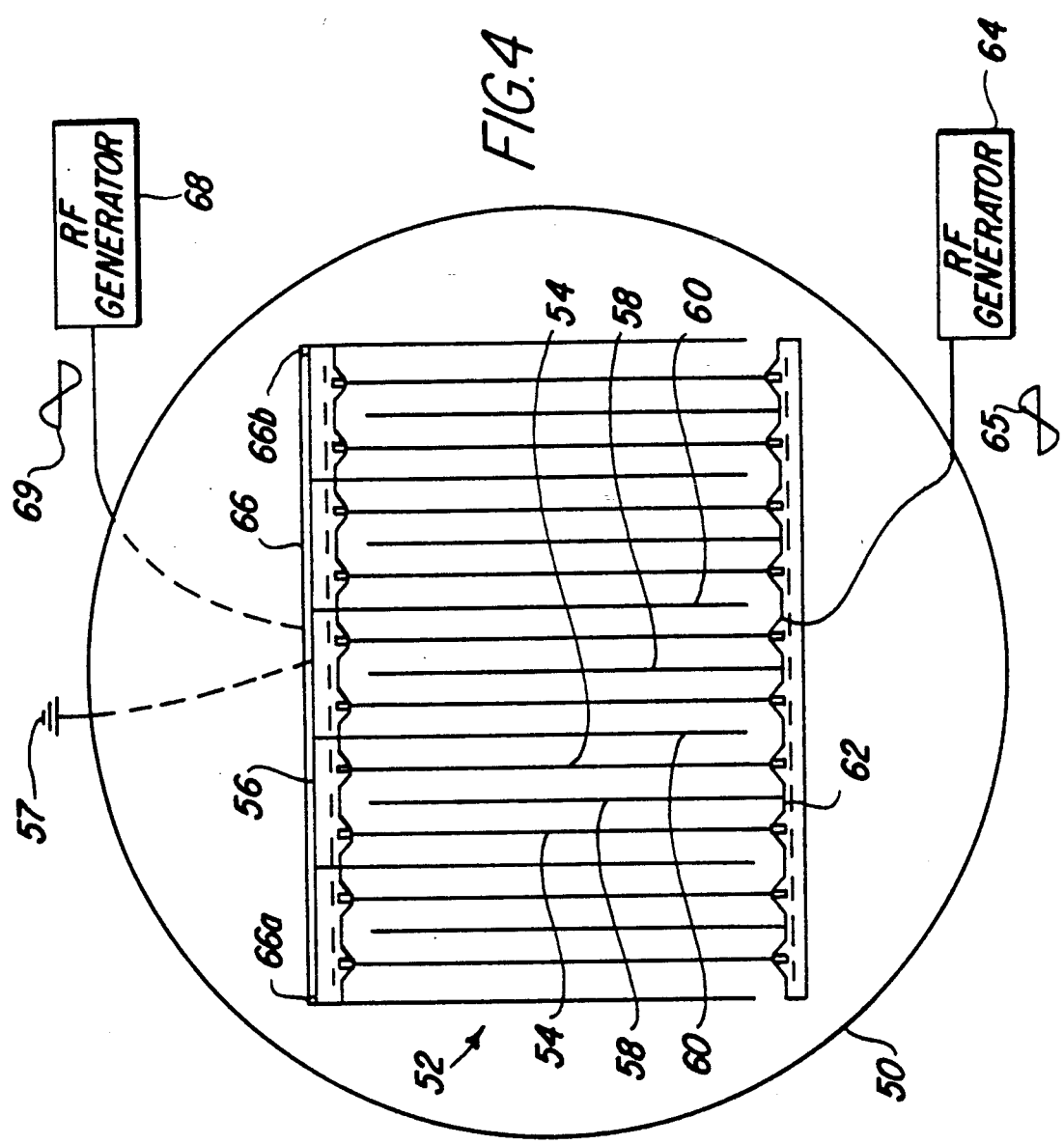

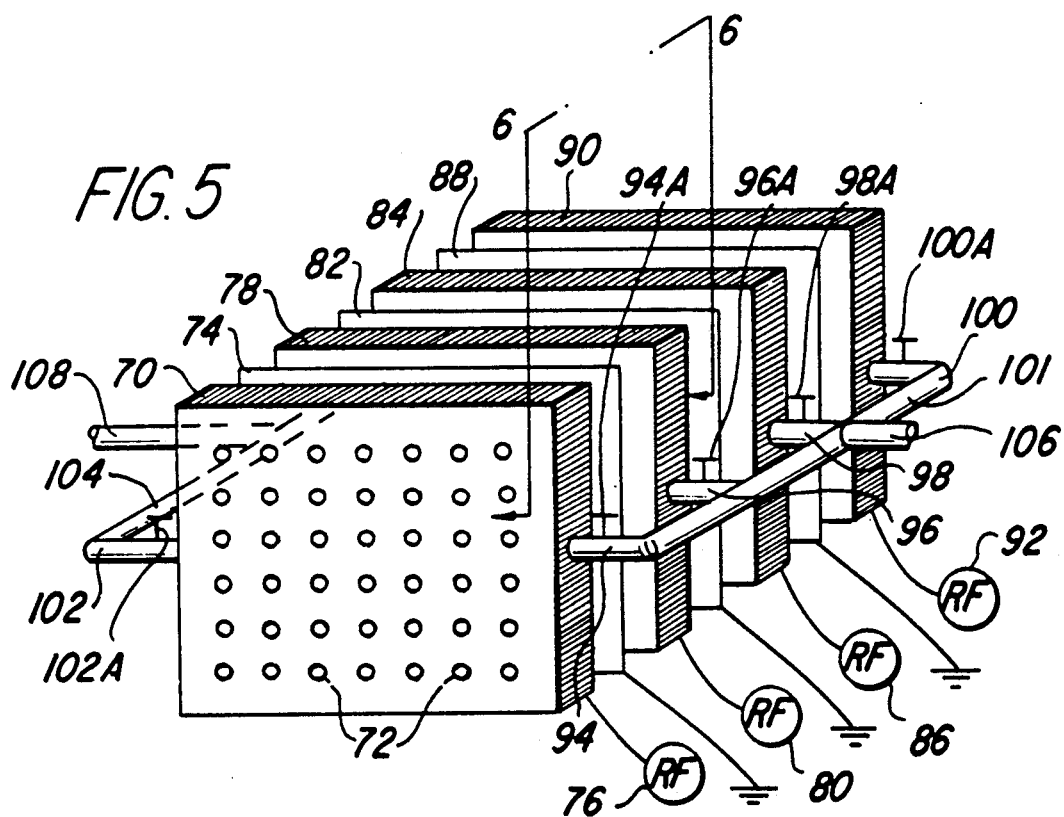
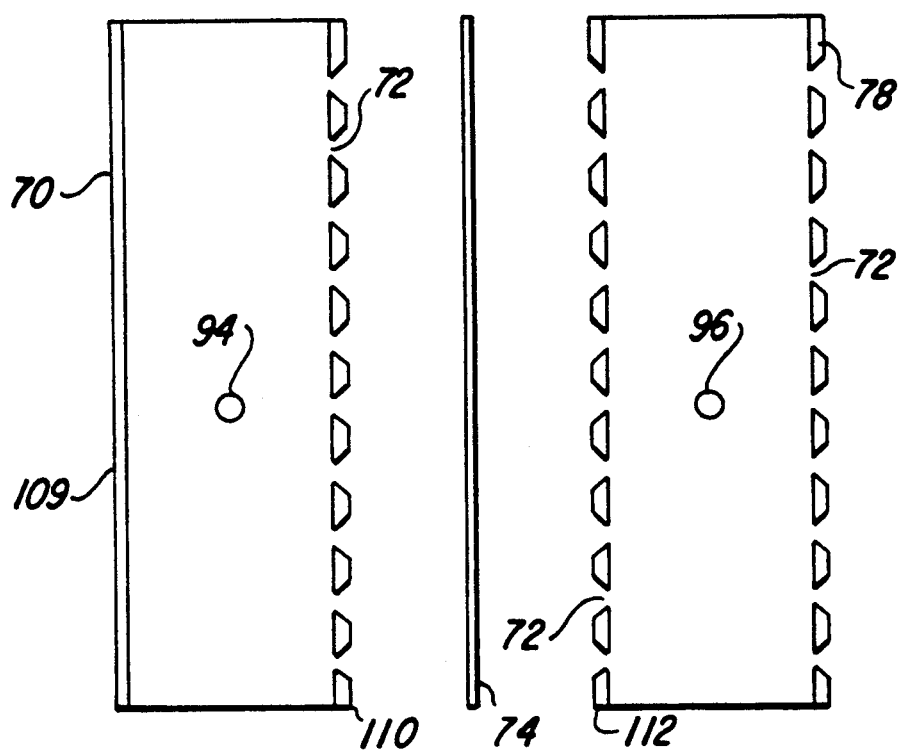

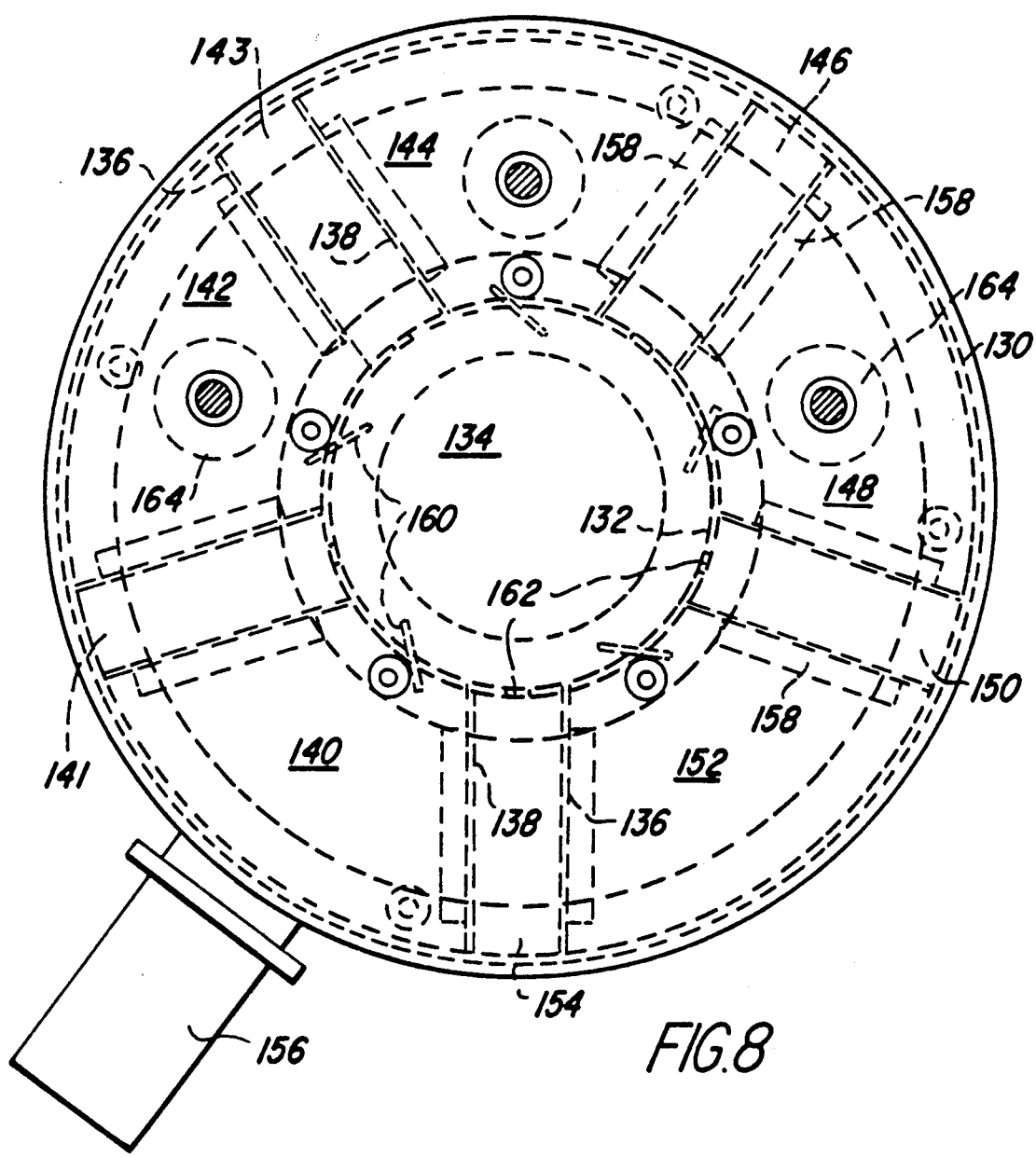

PLASMA PROCESSING APPARATUS INCLUDING THREE BUS STRUCTURES

This application is a divisional application of Ser. No. 409,289, filed Sept. 18, 1989, which is a continuation of Ser. No. 199,838, filed May 27, 1988 and now abandoned, which is a continuation of Ser. No. 894,240, filed Aug. 4, 1986 and now abandoned, which is a continuation of Ser. No. 692,144, filed Jan. 17, 1985, and now abandoned.

RELATED APPLICATIONS

This application is related to the following concurrently filed patent applications assigned to the present assignee Ser. No. 692,145, for "Uniform Plasma for Drill Smear Removal Reactor" by Babu, et al issued Oct. 21, 1986 as U.S. Pat. No. 4,618,477, Ser. No. 692,143, for "Reactor for Plasma Desmear of High Aspect Ratio Hole" by Lo, et al, now U.S Pat. No. 4,601,807.

BACKGROUND OF THE INVENTION

The present invention relates to a system for treating substrates by plasma and, more particularly, to a system for generating uniform plasma for processing a substrate having two major surfaces.

In the manufacture of many electronic components, such as integrated circuits, there is a need to deposit metallic films on substrates. Materials such as copper may be deposited on ceramic or glass substrates and then etched or otherwise fabricated into the electrical circuits and/or components.

In the field of plasma deposition, an atom may be displaced from the surface of a target connected to a cathode by a process called sputtering or sputter deposition. In this process, the target is most often constructed of electrically conductive material such as copper or the like. The cathode to which the target is attached is subjected to a relatively high voltage, either DC or radio frequency, in an inert atmosphere such as argon. The inert gas is ionized, forming an excited gaseous state (plasma) from which positive ions escape to bombard the exposed surface of the target. By momentum transfer, the atoms or clusters of atoms of the target material are thereby dislodged. It is this dislodging of the target atoms that is known as sputtering. By repeating this process, a number of these primarily neutral atoms move through the space in front of the target, in a relatively high vacuum. Eventually these atoms strike and condense on the surface of a receiver, known as a sample or substrate, which is generally in close proximity to the target. A coating of atomic or molecular layers of target material can thus be built on the substrate. The coating, which is generally less than 1 $\mu$m, is called a thin film. It is generally sufficient for the metallization of integrated circuits.

Through holes or viaduct holes (commonly called vias) are paths for electrical interconnections between a first-level conductive pattern and a second-or higher-level conductive pattern. In order to electrically connect circuits on different substrate levels to each other, precious metal (e.g., palladium) seeding and electroless metal deposition have been used to coat the walls of the vias, often followed by electroplating. Most recently, however, plasma technology has been applied to this problem.

In the field of plasma processing of substrates for use as printed circuit boards and cards, nonuniformity of a plasma field can result in nonuniform etching, nonuniform deposition and/or nonuniform cleaning of via holes and through holes, the latter being referred to as desmearing. In the etching process, for example, a more intense plasma field in the center of a board results in a higher etching rate for that portion of the board, whereas a relatively sparse plasma density at the edges of the board results in a proportionally and predictably low etch rate for those sections. It has been found that nonuniformity of an electric field in proximity to an electrically floating printed circuit board results in nonuniform plasma treatment thereof.

Normally, oppositely charged electrodes are provided in a vacuum chamber to initiate a plasma reaction. Such apparatus is shown, for example, in copending patent application, Ser. No. 587,098 filed Mar. 7, 1984 for "Shield for Improved Magnetron Sputter Deposition into Surface Recesses", issued Apr. 2, 1985 as U.S. Pat. No. 4,508,612 and assigned to the present assignee.

U.S. Pat. No. 3,757,733, issued to Reinberg, discloses a cylindrical reactor for use in plasma deposition. Means are provided for establishing a radial flow of reactant gases from the outer region of a support that holds substrates to an inner region of the support. Means are also provided to exhaust gases from the inner region of the support. Such an apparatus, as disclosed, can be used only in batch operations to treat only one major surface of a substrate at a time, as opposed to continuous or semi-continuous operations. Moreover, since much of the reactant gases is consumed, the uniformity of plasma deposition is ensured only for relatively small substrates or wafers. Finally, the apparatus is intended to be used for plasma deposition only, not etching.

U.S. Pat. No. 4,264,393, issued to Gorin, et al, discloses a reactor apparatus for plasma etching or deposition. The apparatus has two parallel plates within the reactor, one of which functions as a manifold for reactant gases which are dispensed through a regular array of orifices into the r.f. field between the plates. The parallel plate structure can be stacked in an array of alternating grounded and r.f. plates to increase the apparatus capacity. The reactant gases are introduced only from one direction (i.e., the plates have an array of orifices only on one side), resulting in one-sided etching of substrates or via holes therein.

The aforementioned references are not appropriate for etching large substrates on both major surfaces or for generating uniform plasma fields over a large area.

It would be advantageous to provide a plasma reactor system for generating uniform plasma fields.

It would further be advantageous to provide a plasma system for uniformly processing the major surfaces as well as the via holes and through holes of large substrates.

It would also be advantageous to process substrates in uniform plasma and electrical fields continuously or semi-continuously, replenishing reactant gases as they are consumed.

It would further be advantageous to use a plasma reactor in continuous fashion for etching and cleaning substrates.

It would be advantageous to provide for bi-directional plasma gas flow against, around and through the substrates for more uniform and efficient plasma processing.

SUMMARY OF THE INVENTION

In accordance with the present invention, there is provided a system for plasma etching predetermined portions of material on the major surfaces of a plurality of substrates. The system comprises a plasma reactor chamber, provision for continuously introducing a gas to be converted in a reactive species by an electrical field, provision for forcing the gas through one or more through holes in the substrates, provision for continuously exhausting gas, an automatic transport or drive mechanism connected to the chamber and to the substrates to facilitate the advancement of substrates seriatim along a predetermined path in the chamber, and a vacuum lock connected to the chamber for maintaining a substantially constant atmosphere in the chamber while each of the substrates is inserted into and removed from the chamber.

BRIEF DESCRIPTION OF THE DRAWINGS

A complete understanding of the present invention may be obtained by reference to the accompanying drawings, when taken in conjunction with the detailed description thereof and in which:

FIG. 4 is a sectional schematic representation of a reactor chamber;

FIG. 5 is a perspective view of a plurality of substrates and hollow electrodes showing gas distribution for use therewith;

FIG. 6 is a cross-sectional view taken along line 6—6 of FIG. 5;

FIG. 8 is an alternative embodiment of a continuous apparatus for plasma processing.

DETAILED DESCRIPTION OF THE PREFERRED EMBODIMENT

Figure 1:
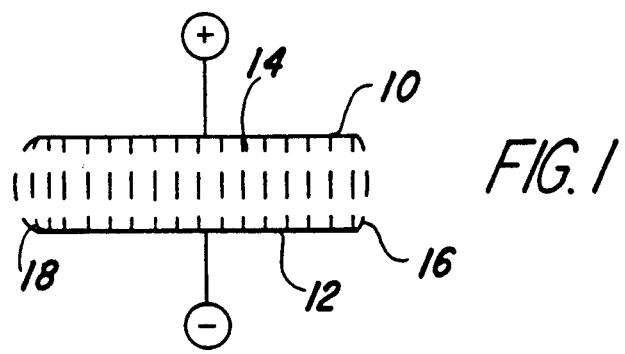
FIG. 1 is a schematic representation of prior art apparatus for producing a plasma field.

Referring now to FIG. 1, there is shown a cross sectional view of a conventional upper panel electrode 10 and a lower panel electrode 12, as is well known in the prior art. Both electrodes 10 and 12 have major axes parallel to one another. This configuration is referred to as parallel plate panel electrodes.

A power supply, not shown, is connected to each of these electrodes 10 and 12. A positive charge is applied to the upper electrode 10 and a negative charge is applied to the lower electrode 12, as shown in FIG. 1 at a given instant of time. The electrical field between parallel electrodes 10 and 12, identified by reference numeral 14, is substantially uniform in the center region. The electrical field is more intense at both edges of the electrodes 10 and 12, however, as shown by reference numerals 16 and 18, respectively. Accordingly, neither the electrical field 14 nor the resulting plasma, not shown, is uniform at all locations proximate the electrodes 10 and 12.

Figure 2:
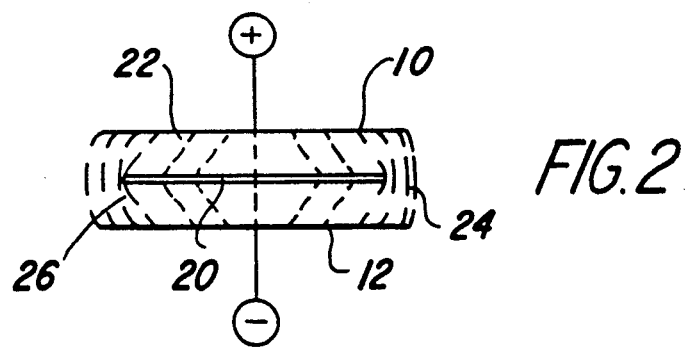
FIG. 2 is a schematic representation of prior art apparatus for creating a plasma field surrounding a substrate.

Referring now also to FIG. 2, there is shown a cross sectional view of the same parallel plate panel electrodes 10 and 12 with a substrate 20 therebetween. The substrate 20 has a major axis substantially parallel to the major axis of the electrodes 10 and 12. The electrical field at a given instant of time has relatively low intensity in the center region 22 proximate the electrodes 10 and 12 and relatively high intensity at the outer edge regions 24 and 26 proximate the electrodes 10 and 12. It can be seen that conventional parallel plate panel electrodes 10 and 12 with a substrate 20 intermediate them results in a nonuniform electrical field.

Figure 3:
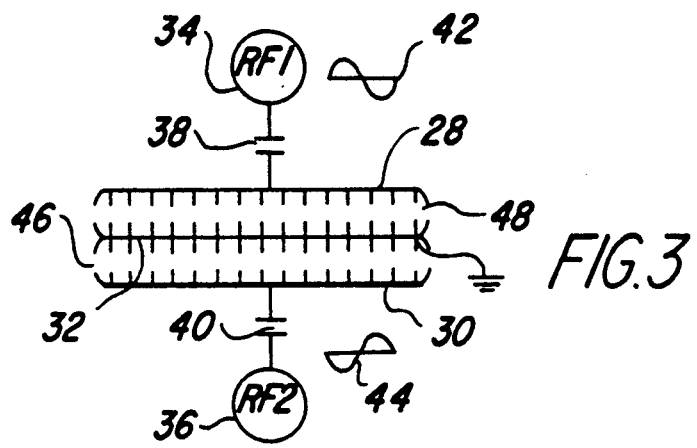
FIG. 3 is a schematic representation of apparatus in accordance with the present invention for creating a uniform plasma field.

Referring now also to FIG. 3, there is shown a plasma reactor system having an upper electrode 28 and a lower electrode 30 parallel thereto. Intermediate these two electrodes 28 and 30 and substantially parallel thereto, is a substrate 32 which is grounded or maintained at zero electrical potential.

An r.f. source of power or generator 34, such as Model No. PM 145 manufactured by the Branson IPC Co., is electrically connected to the upper electrode 28. A second r.f. source of power 36 is electrically connected to the lower electrode 30. In order to match impedance, an impedance matching network 38 is connected to the upper r.f. power source 34 in series with the upper electrode 28. The impedance matching network includes fixed and variable capacitors. A second impedance matching network 40 is connected to the second r.f. power source 36 in series with the lower electrode 30.

Alternating current phase diagrams 42 and 44 indicate the phase differential between r.f. power sources 34 and 36. It can be seen that the r.f. power sources 34 and 36 are 180° out of phase with one another at all times. It can also be seen that the electrical field generated between the upper and lower electrodes 28 and 30, respectively, is substantially uniform along the length of the substrate 32, including the end portions 46 and 48 thereof.

Referring now also to FIG. 4, there is shown a reactor chamber 50 suitable for maintaining a high vacuum for use in plasma processes. Such a chamber 50 can be obtained from the Branson IPC Co., for example, as Model No. 7415. The chamber 50 is evacuated and then argon and oxygen or $CF_4$ are introduced thereto. A housing 52 is disposed within the reactor chamber 50. In the housing 52 are mounted a plurality of cards or boards 54 suitable for having electrical circuits printed thereon. The boards 54 are electrically connected to one another by means of a bus structure 56 which, in turn, is grounded 57.

Electrodes 58 and 60 are placed alternately on either side of the substrates 54. Electrodes 58 are electrically connected to one another by means of a bus structure 62. The bus structure 62 is electrically connected to an r.f. power generator 64 which is adapted, in the preferred embodiment, to operate at 13.5 MHz. It has been discovered that for high aspect ratio through holes (i.e., those whose ratio of hole length to diameter is greater than 6:1), an r.f. power generator operating at a much lower frequency (e.g., 50 KHz) prevents creation of polymer species from feed gas. U.S. Pat. No. 4,425,210 issued to Fazlin, for example, discloses relatively low frequency r.f. values. Thus the ionic plasma species etchants respond to the r.f. field to reach the through hole interior, providing uniform etch thereof. Phase diagram 65 represents the phase of the r.f. generator 64 at a given moment of time.

Similarly, remaining electrodes 60 are connected to one another by means of another bus structure 66. Bus structure 66 is electrically isolated from, although physically supported by, bus structure 56 by means of insulating members 66a and 66b. This second bus structure 66 is electrically connected to a second r.f. power generator 68 also adapted to operate at 13.5 MHz Phase diagram 69 represents the phase of second r.f. generator 68. The electrical signal from the first r.f. generator 64 is 180° out of phase with the electrical signal generated by the second r.f. generator 68 in the preferred embodiment. A comparison of AC phase diagrams 65 and 69 indicates this phase differential relationship.

It has also been discovered that a phase differential between the r.f. power generators 64 and 68 results in a more uniform electric field than can be obtained either by a single r.f. power generator or by a plurality of r.f. generators, all being in phase with one another. The phase differential need not be 180°. Thus, it should be understood that any phase differential between r.f. power generators 64 and 68 is within the scope of the present invention. It should also be understood that in another embodiment only one r.f. generator need be used in conjunction with the reactor chamber 50, provided that two or more electrical output signals are independently created thereby, each being out of phase with one another.

Gas inlet and gas outlet pipes or tubes, not shown, are connected to the reactor chamber 50 to introduce gas thereto or to remove gas therefrom as required. In operation, continuous gas introduction and exhaust can be accomplished by one or more of such lines connected to the chamber 50.

Referring now also to FIG. 5, there is shown a hollow electrode plasma system. This hollow electrode plasma system is surrounded by a plasma chamber, not shown, the interior of which is covered and protected by nonconductive material such as Teflon material. (Teflon is a registered trademark of E. I. duPont de Nemours Co.)

A first hollow electrode 70 has a plurality of holes 72 drilled or punched in one major surface thereof. The holes are shown in phantom in FIG. 5. The holes 72 are also shown in a rectilinear, uniform matrix pattern in the preferred embodiment. But it should be understood that any pattern of holes 72 that ensures uniform gas distribution may be used.

In spaced apart relationship to this first hollow electrode 70 is a substrate 74, the major axis of which is parallel to the major axis of the electrode 70. Connected to the electrode 70 is an r.f. power supply 76. The substrate 74 is grounded.

Immediately adjacent and substantially parallel to the substrate 74 is a second hollow electrode 78 having a plurality of holes, not shown, drilled or punched through both major surfaces thereof. A second r.f. power supply 80 is electrically connected to this hollow electrode 78. In a like manner, another substrate 82 is positioned substantially parallel to the hollow electrode 78 and is also grounded.

A third hollow electrode 84 is positioned substantially parallel to the substrate 82. This electrode 84 also has a plurality of holes, not shown, drilled or punched completely therethrough. Another r.f. power supply 86 is connected to this hollow electrode 84. Another substrate 88 is placed substantially parallel to the third hollow electrode 84 and is also grounded.

Finally, a fourth hollow electrode 90 having holes, not shown, drilled or punched therethrough on one major surface only is placed substantially parallel to the substrate 88 and is, in turn, electrically connected to a last r.f. power supply 92.

Gas inlet pipes 94, 96, 98 and 100 are connected to the hollow electrodes 70, 78, 84 and 90, respectively. Independently operable valves 94a, 96a, 98a and 100a are placed in corresponding inlet pipes 94, 96, 98 and 100 to shut off the flow of gas therethrough. Connected to the inlet pipes 94, 96, 98, 100 is an inlet manifold 101 for distributing gas evenly to the hollow electrodes 70, 78, 84, 90.

On the side of the electrodes opposite the gas inlet manifold 101 are gas outlet pipes, one of which being 102, having independently operable valves 102a corresponding to each pipe. The gas outlet pipes associated with hollow electrodes 78, 84 and 90 are not shown in FIG. 5. All of the gas outlet pipes are connected to their associated hollow electrodes and to an outlet manifold 104 for allowing gas to be exhausted from the hollow electrodes uniformly.

A main gas feed line 106 is connected to the inlet manifold 101. Similarly, a main gas exhaust line 108 is connected to the outlet manifold 104.

It should be understood that the function of the gas inlet lines 106, 94, 96, 98, 100 and manifold 101 and the function of the gas outlet lines 108, 102 and manifold 104 can be reversed, if desired. That is, when appropriate, gas may be introduced by means of the main gas exhaust line 108 and exhausted by means of the main gas feed line 106.

The use of inlet and outlet pipes in direct conjunction with hollow electrodes maximizes gas distribution and flow across the substrates, thus ensuring uniformity of gas flow as well as uniformity of electric field. The advantage of these combined uniformities is a more accurate and uniform etching or deposition during the plasma process.

The function of valves 94a, 96a, 98a, 100a, 102a and those not shown should also be described for a clear understanding of the hollow electrode plasma system. When gas is introduced under pressure from the main gas feed line 106 through the inlet manifold 101, valves 94a, 96a, 98a and 100a are placed in an open position to allow the gas to reach and enter the hollow electrodes 70, 78, 84 and 90 respectively. When the outlet pipe valves 102a and others, not shown, are placed in a closed position, the gas is forced through the hollow electrode holes 72. In this manner, gas introduced into the hollow electrodes 70, 78, 84, 90 under pressure by means of the corresponding gas inlet ports 94, 96, 98, 100 is distributed through the electrode holes 72 to impinge on the substrates 74, 82, 88 in a substantially uniform manner.

It can be seen that suitable settings of inlet valves 94a, 96a, 98a and 100a and outlet valves 102a and others, not shown, can result in gas flowing through the hollow electrodes 70, 78, 84, 90 in any one of a number of gas flow patterns. Individual substrates or groups of substrates can be processed by appropriately setting the inlet and outlet valves and selecting the main gas feed line 106 and main gas exhaust line 108. It should also be understood that any number of hollow electrodes and alternating substrates may be used in accordance with this invention. The gas inlet lines 94, 96, 98 and 100 are used to introduce gas with which a plasma reaction may be maintained. Such gases are commonly $CF_4$, $O_2$, ammonia, freon and the like. A gas composition having a mixture of any of the aforementioned molecules can also be used. Moreover, as previously mentioned, a mixture of argon and oxygen can be used with relatively low r.f. power generator frequencies to clean high aspect ratio through holes.

In the preferred embodiment, the phase differential among r.f. power sources is as follows. R.f. power supplies 76 and 86 are in phase with one another. R.f. power supplies 80 and 92, while being in phase with one another, are 180° out of phase with the aforementioned r.f. power supply pair 76 and 86. Typical frequencies are in the range of 50 KHz to 3.5 MHz.

Referring now also to FIG. 6, there is shown a cross-sectional portion of hollow electrodes 70 and 78 and substrate 74 therebetween, taken along line 6—6 of FIG. 5. The hollow electrode 70 has two walls: a left, solid wall 109 and a right wall 110 with holes 72. The holes 72 of the right wall 110 of electrode 70 are tapered in such a way as to allow a dispersion of gas from the left portion of the reactor chamber 50 (FIG. 4) to the right portion thereof. Thus, the holes 72 in electrode 70 have a smaller diameter on the left side of wall 110 and a larger diameter on the right side of wall 110 of the electrode 70.

The orientation of the tapered holes 72 is reversed on the left wall 112 of the hollow electrode 78 so as to allow uniform gas distribution to the rightmost major surface of the substrate 74. It should be understood that tapering of the holes 72 in the manner shown is useful for one substrate 74 shown in this example placed intermediate two hollow electrodes 70 and 78. Alternative arrangements and orientations of electrode holes 72 can easily be designed for modifications to the plasma process, depending on gas flow direction and number of substrates to be processed concurrently.

Figure 7:
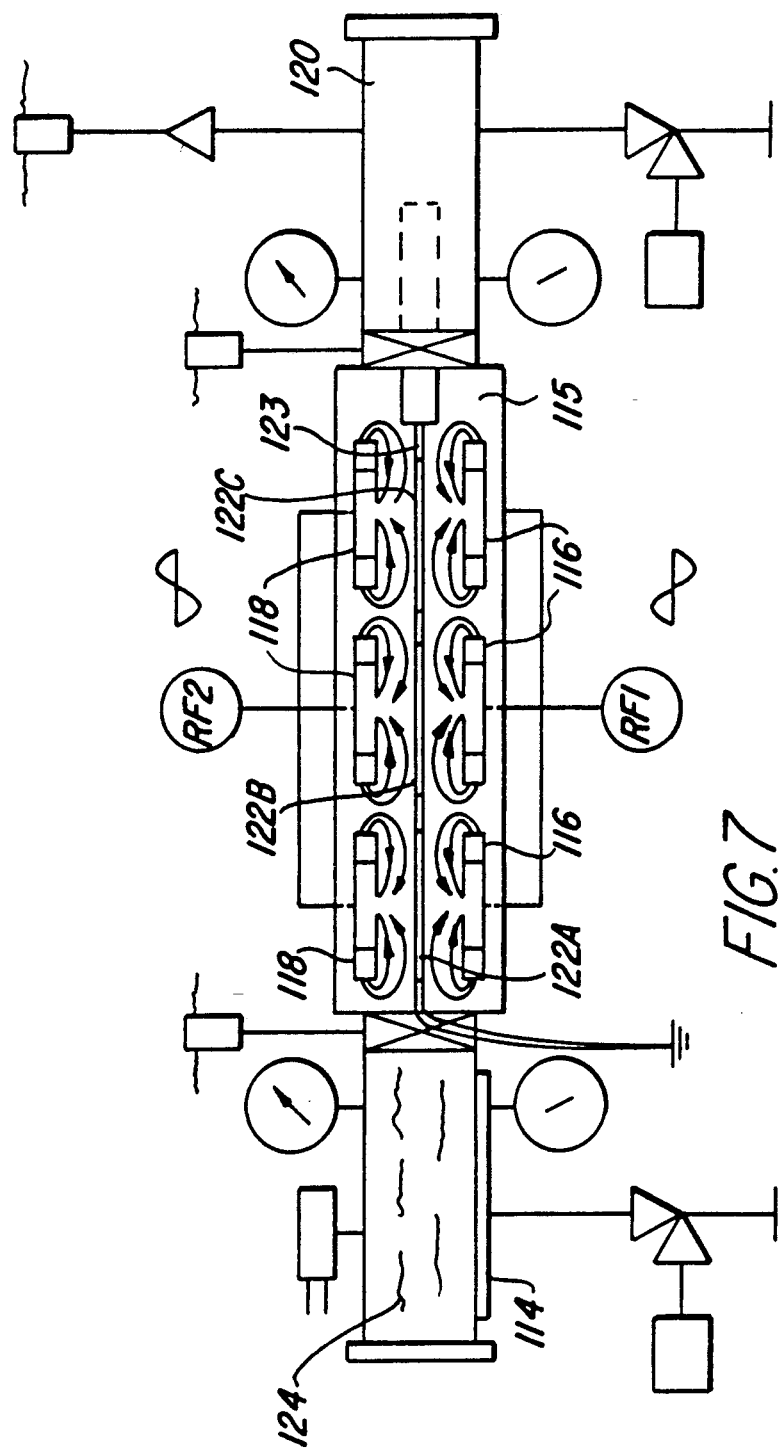
FIG. 7 is a top sectional view of a continuous apparatus in accordance with the present invention.

Referring now also to FIG. 7, there is shown a top view of a system adapted for use in a continuous plasma treatment process having uniform gas flow and uniform electric field. A vacuum lock 114 is connected to a linear reactor chamber 115. The vacuum lock 114 is used to permit substrates 122a, 122b, 122c or other articles to enter the reactor chamber 115 and move along a transport track 123 without affecting the atmosphere or vacuum therein.

Within the reactor chamber 115 and on one side of the centerline thereof are three hollow electrodes 116 which are electrically connected to an r.f. power supply, RF1. These three electrodes 116 are thus in electrical phase with one another.

Three other hollow electrodes 118 are disposed on the opposite side of the reactor centerline, each of which corresponding to one of the aforementioned electrodes 116. The electrodes 118 are electrically connected to a second r.f. power supply RF2 and are in phase with one another, but 180° out of phase with respect to electrodes 116.

A second vacuum lock 120 is attached to the reactor chamber 115 on the side opposite the first vacuum lock 114. Vacuum lock 120 is used to remove substrates 122a, 122b, 122c from the reactor chamber 115 without affecting the atmosphere or vacuum therein.

In FIG. 7, substrates 122a, 122b, 122c are shown in a vertical orientation. It should be understood that the orientation of the electrodes 116 and 118 may likewise be parallel to one another and horizontally disposed, similar to the schematic orientation shown in FIG. 3. The substrates 122a, 122b, 122c are grounded in the preferred embodiment, but may be maintained at a fixed voltage potential throughout the plasma process.

In operation, the substrates 122a, 122b, 122c are advanced along the transport track 123 from the initial vacuum lock 114 through the reactor chamber 115, between hollow electrodes 116 and 118 and through second vacuum lock 120. A drive mechanism, not shown, advances each substrate on the transport track 123 linearly from one location in the reactor apparatus to another sequentially and continuously. Heating elements 124, disposed within the initial vacuum lock 114, can be used to preheat the substrates 122a, 122b, 122c before plasma etching or deposition occurs.

Provision is made, not shown, for introducing and exhausting gas used in plasma treatment through the hollow electrodes 116 and 118 in accordance with the description hereinabove presented in conjunction with FIG. 5. The flow of gas through the hollow electrodes 116 and 118 and around and through the substrates 122a, 122b, 122c is shown in FIG. 7 as arrowed lines. The hollow electrodes 116 and 118 have apertures on both sides as well as a series of holes forming a center sink intermediate the walls facing the substrates 122a, 122b, 122c.

In an alternate embodiment, not shown, the reactor chamber 115 can be divided into two or more sections, each being isolated from one another and each being adapted to process substrates with a different gaseous composition. Alternatively, one or more secondary reactor chambers can be placed between the primary reactor chamber 115 and the vacuum lock 120 in each of which a different plasma process can be maintained, each independently from one another. Such a series of plasma treatment stages can be useful, for example, in etching, hole cleaning, board preparation and deposition or any combination of the above.

Referring now also to FIG. 8, there is shown a circular reactor chamber for continuous or semi-continuous plasma processing. The unit comprises essentially two cylindrical elements 130 and 132 at the upper and lower ends of which are secured upper and lower closure plate members, not shown in this top cross sectional view.

The inner cylinder 132, which forms the vacuum manifold 134, provides for connecting into a central vacuum pump.

Between the outer and inner cylinders 130 and 132, numerous suitable radial partition assemblies such as 136 and 138, extending generally radially, divide the apparatus into a number of separate processing regions or chambers, such as 140 through 154, inclusive. These separate chambers are constructed so that a ring-like platform, not shown, may be suitably rotated within and through them to carry substrates.

A conventional air lock or vacuum lock element 156 leads into one of the chambers 140 and provides for loading and unloading the substrates carried on the rotary ring platform. The control provides essentially a vacuum locking device which isolates the load and unload chamber 140 from all other portions of the unit. Isolation of the vacuum processing chambers 140 through 154 is achieved and effected by providing an extremely close tolerance between the substrate carrier platform and a differentially pumped isolation compartment 141.

The carrier platform is arranged to pass from one chamber, such as 142 into an adjacent chamber 144, through openings provided in the walls of the radially extending partition assembly members 136 and 138. These openings are usually arranged in a rectangular form through the use of a series of right angled duct-like elements 158 to provide a controlled leakage path at both the top and the sides through which the platform moves. One side of the angled elements 158 is fastened to the partition wall 136, while the other side is free, except for the connection at the abutting edges which are welded or soldered to make a tight fit. This controlled leakage path provides efficient isolation of one process environment from another.

The ring platform may be driven from any desired form of prime mover such as a motor and appropriate gears, not shown. The outer edge of the ring-like platform may be formed as a toothed member, for example, with the teeth adapted to mesh with the teeth of a driving pinion so that rotation is readily achieved. Of course, other forms of drives such as frictional members may be utilized. The apparatus described here is purely for convenience.

As can be appreciated from the showing of FIG. 8, the central vacuum manifold 134 is common to all of the formed chambers, 140 through 154.

A valve element 160 of the generally butterfly type leads from each formed processing chamber into this central manifold 134. By suitable rotation of the valve 160, the specified processing chamber can be opened to the manifold 134 or can be closed off therefrom. In this way, a single high speed vacuum pumping system, such as a diffusion or turbo pump, when connected to lead to vacuum manifold 134, can provide the necessary vacuum to all of the different formed processing chambers and radial partition assemblies. The pumping system can be further connected to various mechanical pumps for establishing desired vacuum level.

Each of the separate valves 160 constitutes a controllably variable conductance element which is supported in the inner cylindrical wall. It is thus possible to have a multiplicity of differentially pumped processing chambers because of the radial partition assemblies separating each from the central vacuum manifold 134.

The vacuum manifold communication to the radial partition assemblies between the separate chambers, such as 144 and 148, is provided by a fixed or controllable conductance entrance port 162 connected to corresponding isolation compartments between walls such as 136 and 138, so that the pressure therein is almost as low as that within the manifold 134 leading to the vacuum pump. Because of leakages and similar effects, this isolating region or compartment is usually at a slightly higher pressure than that of the vacuum manifold 134. The highest system pressure is, of course, found within such chambers as 140, 142, 144, 148, etc. It is these regions or compartments which constitute the various processing component volumes.

The ring platform successively moves within the different processing chambers and, as this occurs, the supported substrates which may be included within an appropriate atmosphere introduced in any appropriate and desired manner may be sputter treated by r.f. excitation of sputtering cathode elements 164 positioned within the various chambers or other vacuum processes. If desired, and in order that the relative pressures in the different chambers shall be separately controllable, it is apparent that each of the control mechanisms conventionally represented for turning the valves 160 may be automatically operated. The directly pumped controlled leakage slots in the radial partition assembly 136, 138 eliminate process chamber contamination from one compartment to that adjacent to it.

In operation, the substrate carrier platform is confined to the vacuum environment. This reduces outgassing. The directly pumped radial partition assemblies, as already noted, serve substantially to eliminate compartment contamination.

A 4 ft. diameter circular processing chamber is approximately the equivalent of an 11 ft. length linear, in-line section. The circular processing system provides for substrate loading and unloading in adjacent areas, as contrasted with the in-line system which requires loading and unloading at opposite ends of the system, as previously described.

In addition, the circular arrangement (FIG. 8) with the centrally located pumping system beneath the processing chambers makes necessary only a single pump-out unit.

With the circular reactor arrangement, the loading of substrates as well as the unloading thereof is achievable by any desired form of simple automatic method and permits a continuous or semi-continuous operation without causing the environment to vary. It is also readily controllable by computer control for different types of processing and purely automatic operation.

It should be understood that the circular reactor apparatus, as well as the longitudinal reactor apparatus described in FIG. 7, can be used with boards or substrates transported either vertically or horizontally.

An oxygen plasma can be used in the continuous plasma device hereinabove described to improve adhesion between copper, the most commonly used electrical conductor, and epoxy, a nonconductive material.

Since other modification and changes varied to fit particular operating requirements and environments will be apparent to those skilled in the art, the invention is not considered limited to the examples chosen for purposes of disclosure, and covers all changes and modifications which do not constitute departures from the true spirit and scope of this invention.

What is claimed is:

1. An apparatus for plasma processing a plurality of substrates simultaneously, comprising:
   a) a plasma reactor chamber;
   b) a housing mounted within said plasma reactor chamber;
   c) a plurality of electrodes disposed in said housing substantially parallel to each other, each of said electrodes being of hollow configuration and including a pair of substantially flat sides each having a plurality of tapered apertures therein;
   d) means for supporting a substrate between each pair of electrodes and parallel thereto;
   e) a first bus structure for connecting said substrates electrically;
   f) a second bus structure for connecting alternate ones of said electrodes electrically;
   g) a third bus structure for connecting the remaining ones of said electrodes electrically;
   l) means for supplying a reactive gas to said plasma reactor chamber, said means directing said gas through said apertures within said sides of said electrodes such that said gas emerges from said apertures and is uniformity distributed across the respective surface of said substrate that said electrode faces;
   i) means for exhausting said plasma reactor-chamber;
   j) a first radio frequency power source electrically connected to said second bus structure; and
   k) a second radio frequency power source electrically connected to said third bus structure and adapted to operate about 180 degrees out of phase with said first radio frequency power source.

2. The apparatus of claim 1, wherein said first bus structure is electrically ground.

3. The apparatus of claim 1 wherein each of said tapered apertures possesses a smaller diameter on the interior of said flat sides than the diameter of said aperture on the exterior of said sides.

* * * * *